United States Patent
Liu et al.

(10) Patent No.: US 10,224,324 B2
(45) Date of Patent: Mar. 5, 2019

(54) METHOD FOR MANUFACTURING SEMICONDUCTOR DEVICE HAVING GATE STRUCTURE WITH REDUCED THRESHOLD VOLTAGE

(71) Applicant: UNITED MICROELECTRONICS CORP., Hsinchu (TW)

(72) Inventors: Wei-Hsin Liu, Taichung (TW); Pi-Hsuan Lai, Kaohsiung (TW)

(73) Assignee: UNITED MICROELECTRONICS CORP., Hsinchu (TW)

(*) Notice: Subject to any disclaimer, the term of this patent is extended or adjusted under 35 U.S.C. 154(b) by 0 days.

(21) Appl. No.: 15/681,570

(22) Filed: Aug. 21, 2017

(65) Prior Publication Data
US 2017/0345819 A1 Nov. 30, 2017

Related U.S. Application Data

(62) Division of application No. 15/136,030, filed on Apr. 22, 2016, now Pat. No. 9,793,267.

(51) Int. Cl.
| | |
|---|---|
| *H01L 27/02* | (2006.01) |
| *H01L 27/11* | (2006.01) |
| *H01L 21/033* | (2006.01) |
| *H01L 27/088* | (2006.01) |
| *H01L 21/8234* | (2006.01) |

(52) U.S. Cl.
CPC ........ *H01L 27/088* (2013.01); *H01L 21/0332* (2013.01); *H01L 21/823456* (2013.01); *H01L 27/0207* (2013.01); *H01L 27/1104* (2013.01); *H01L 27/1116* (2013.01)

(58) Field of Classification Search
None
See application file for complete search history.

(56) References Cited

U.S. PATENT DOCUMENTS

| | | | |
|---|---|---|---|
| 8,436,404 B2 | 5/2013 | Bohr et al. | |
| 8,772,168 B2 | 7/2014 | Xie et al. | |
| 2010/0285644 A1* | 11/2010 | Lee | H01L 27/10823 438/239 |
| 2014/0252460 A1 | 9/2014 | Lee et al. | |

OTHER PUBLICATIONS

T. Ando et al., "Understanding and mitigating High-k induced device width and length dependencies for FinFET replacement metal gate technology," Dec. 2015, IEEE International Electron Devices Meeting (IEDM), Washington, DC, 2015, pp. 21.1.1-21.1.4. doi: 10.1109/IEDM.2015.7409747.

\* cited by examiner

*Primary Examiner* — Moazzam Hossain
*Assistant Examiner* — Stanetta D Isaac
(74) *Attorney, Agent, or Firm* — WPAT, PC

(57) ABSTRACT

A semiconductor device is provided, including: a substrate having a first area and a second area; several first gate structures formed at the first area, and at least one of the first gate structures including a first hardmask on a first gate, and the first gate structure having a first gate length; several second gate structures formed at the second area, and at least one of the second gate structures including a second hardmask on a second gate, and the second gate structure having a second gate length. The first gate length is smaller than the second gate length, and the first hardmask contains at least a portion of nitrogen ($N_2$)-based silicon nitride (SiN) which is free of OH concentration.

15 Claims, 12 Drawing Sheets

METHOD FOR MANUFACTURING SEMICONDUCTOR DEVICE HAVING GATE STRUCTURE WITH REDUCED THRESHOLD VOLTAGE

CROSS REFERENCE TO RELATED APPLICATIONS

This application is a Divisional of U.S. patent application Ser. No. 15/136,030, filed Apr. 22, 2016 (now allowed) and entitled "SEMICONDUCTOR DEVICE HAVING GATE STRUCTURE WITH REDUCED THRESHOLD VOLTAGE AND METHOD FOR MANUFACTURING THE SAME", the contents of which are incorporated herein by reference.

BACKGROUND

Technical Field

The disclosure relates in general to a semiconductor device and a method for manufacturing the same, and more particularly to a semiconductor device having gate structure with reduced threshold voltage and a method for manufacturing the same.

Description of the Related Art

Size of semiconductor device has been decreased for these years. Reduction of feature size, improvements of the rate, the efficiency, the density and the cost per integrated circuit unit are the important goals in the semiconductor technology. The electrical properties of the device have to be maintained even improved with the decrease of the size, to meet the requirements of the commercial products in applications. Besides complete profiles of the related elements of a semiconductor device, the electrical characteristics of the related elements are also the major concern during design of scale-down device. Typically, the gate length of the gate structure decreases, the threshold voltage (Vt) increases.

SUMMARY

The disclosure is directed to a semiconductor device having gate structure with reduced threshold voltage and a method for manufacturing the same. The proposed structure and method of the present embodiments provide a way for effectively preventing the gates from damage by OH species, and decreasing the threshold voltage of the gates formed on any location on the substrate for improving the electrical characteristics of the semiconductor device.

According to one aspect of the present disclosure, a semiconductor device is provided, including: a substrate having a first area and a second area; a plurality of first gate structures formed at the first area, and at least one of the first gate structures comprising a first hardmask on a first gate, and the first gate structure having a first gate length; a plurality of second gate structures formed at the second area, and at least one of the second gate structures comprising a second hardmask on a second gate, and the second gate structure having a second gate length. The first gate length is smaller than the second gate length, and the first hardmask comprises at least a portion of nitrogen ($N_2$)-based silicon nitride (SiN) which is free of OH concentration.

According to another aspect of the present disclosure, a method for manufacturing a semiconductor device is provided. A substrate having a first area and a second area is provided. A plurality of first gate structures are formed at the first area, and at least one of the first gate structures comprises a first hardmask on a first gate, and the first gate structure has a first gate length. A plurality of second gate structures are formed at the second area, and at least one of the second gate structures comprises a second hardmask formed on a second gate, and the second gate structure has a second gate length. The first gate length is smaller than the second gate length, and the first hardmask comprises at least a portion of nitrogen ($N_2$)-based silicon nitride (SiN) which is free of OH concentration.

Figure 1:
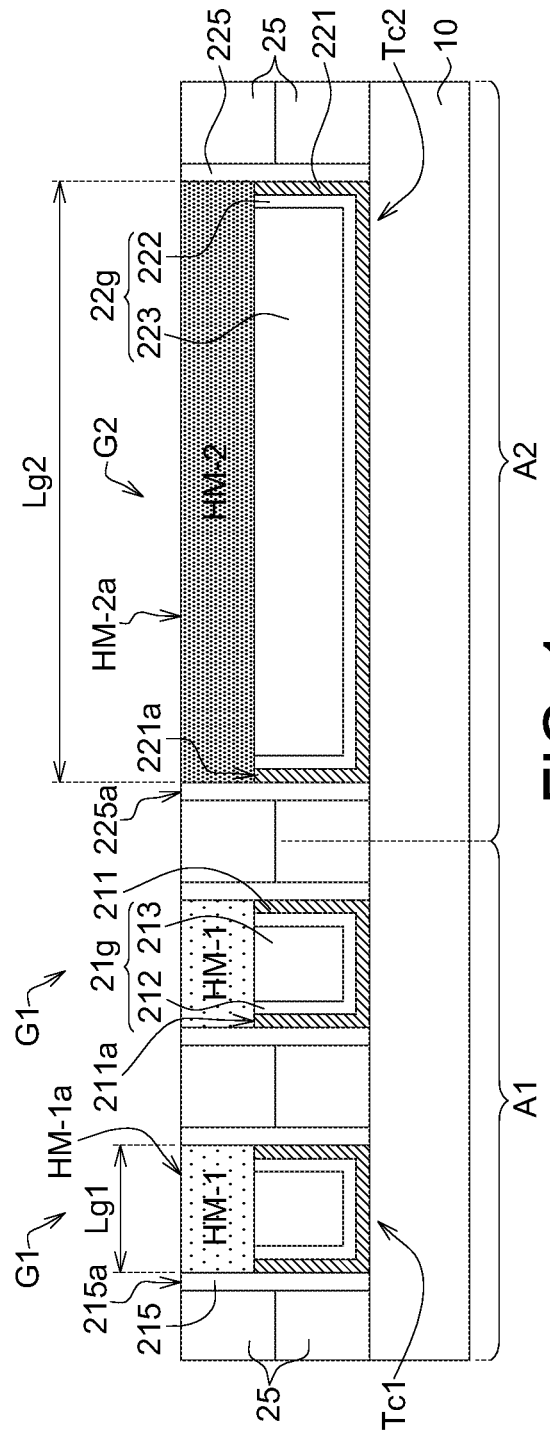
FIG. 1 illustrates a semiconductor device having gate structures according to the first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In the embodiment of the present disclosure, a semiconductor device and a method for manufacturing the same are provided. According to the embodiments, an OH-free hardmask (i.e. the hardmask material containing no OH species) is formed on the gate of the gate structure, especially formed on the gate with smaller gate length. In one embodiment, a nitrogen ($N_2$)-based silicon nitride (SiN) deposited by using $N_2$ and silane as precursor is formed on the gate. Also, the OH-free hardmask covers the top surface of the gate oxide, so as to stop OH species from penetrating into the gate through the gate oxide. The present invention can be applied to manufacture different types of the semiconductor devices having gates with lower threshold voltages (Vt) so as to improves the electrical characteristics of the semiconductor devices. The application area of the semiconductor device can be determined according to the design requirements of practical application to reduce the threshold voltage (Vt) of the gate formed on any location on the substrate, and/or to control the Vt roll-up for improving the electrical characteristics of the semiconductor device.

The embodiments can be applied to manufacture different types of semiconductor devices having gates structures with reduced Vt in the different areas, such as the semiconductor devices having memory cells (such as SRAM) with high-k metal gates (HKMG). Embodiments are provided hereinafter with reference to the accompanying drawings for describing the related procedures and configurations. For example, a semiconductor device having the first gate structures with narrower gate lengths in the first area and the second gate structures with wider gate lengths in the second area is exemplified for illustration. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not necessarily be drawn to scale. Thus, the specification and the drawings are to be regard as an illustrative sense rather than a restrictive sense.

Moreover, use of ordinal terms such as "first", "second", "third" etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

First Embodiment

FIG. 1 illustrates a semiconductor device having gate structures according to the first embodiment of the disclosure. According to the embodiment, a semiconductor device comprises a substrate 10 having a first area A1 and a second area A2, several first gate structures G1 formed at the first area A1, and several second gate structures G2 (one G2 depicted in FIG. 1 for simple illustration) formed at the second area A2. In the first area A1, at least one of the first gate structures G1 includes a first hardmask HM-1 on a first gate 21g (such as the first metal gate including the work function metal layer 212 and the thick metal layer 213 (ex: tungsten)), and the first gate structure G1 has a first gate length Lg1. In the second area A2, at least one of the second gate structures G2 includes a second hardmask HM-2 on a second gate 22g (such as the second metal gate including the work function metal layer 222 and the thick metal layer 223 (ex: tungsten)), and the second gate structure G2 has a second gate length Lg2. The first gate length Lg1 is smaller than the second gate length Lg2, and the first hardmask HM-1 comprises at least a portion of nitrogen ($N_2$)-based silicon nitride (SiN) which is free of OH concentration. That is, the first hardmask HM-1 comprises OH-free silicon nitride, and the second hardmask HM-2 has higher OH concentration ([OH]) than the first hardmask HM-1.

According to the embodiment, the first area A1 can be a memory area to form several static random-access memory (SRAM) cells for data storage, and the second area A2 can be a peripheral area. Alternatively, the first area A1 may include memory cells having gate structures with narrower gate lengths, and the second area A2 may include memory cells having gate structures with wider gate lengths. In practical application, the first area A1 and the second area A2 include several gate structures, but the drawings (such as FIG. 1, FIG. 3 and the manufacturing methods of FIG. 2A-FIG. 2F and FIG. 4A-FIG. 4D) only schematically show two of the first gate structures G1 and one of the second gate structures G2 for the purpose of clear demonstration.

In one embodiment, the first gate structure G1 includes a first gate oxide 211 formed as a first liner in a first gate trench Tc1; the first gate 21g formed in the first gate trench, and the sidewalls and the bottom surface of the first gate 21g are surrounded by the first gate oxide 211; the first hardmask HM-1 formed on the first gate 21g and at least covers a top surface 211a of the first gate oxide 211; and the first spacers 215 formed adjacent to the first gate trench Tc1. As shown in FIG. 1, the first hardmask HM-1 covers the top surface 211a of the first gate oxide 211 and the top surface of the first gate 21g. Also, the top surface 215a of the first spacers 215 are higher than the top surface 211a of the first gate oxide 211.

Similarly, in one embodiment, the second gate structure G2 includes a second gate oxide 221 formed as a second liner in a second gate trench Tc2; the second gate 22g formed in the second gate trench, and the sidewalls and a bottom surface of the second gate 22g are surrounded by the second gate oxide 221; the second hardmask HM-2 formed on the second gate 22g; and the second spacers 225 formed adjacent to the second gate trench Tc2. Also, the top surface 225a of the second spacers 225 are higher than the top surface 221a of the second gate oxide 221 in the second gate trench Tc2. Also, the adjacent first spacers 215 and the adjacent second spacers 225 are separated by the insulation 25. The first spacer 215 and the second spacer 225 are separated by the insulation 25. The insulation 25 could be a single layer or a multi-layer.

According to the embodiment, the first hardmask HM-1 (majorly formed in the gate with a narrower gate length) comprises silicon nitride (SiN) free of OH concentration, such as nitrogen ($N_2$)-based SiN. The second hardmask HM-2 (majorly formed on the gate with a wider gate length) comprises $NH_3$-based SiN. One of the manufacturing methods is exemplified for illustrating the procedures for manufacturing the semiconductor device of the first embodiment.

FIG. 2A-FIG. 2F illustrate a method for manufacturing a semiconductor device according to the first embodiment of the disclosure. The identical elements of FIG. 2A-FIG. 2F and FIG. 1 are designated with the same reference numerals for the purpose of clear illustration.

First, a substrate 10 having a first area A1 and a second area A2 is provided, wherein several first gate structures G1 (ex: two first gate structures G1) are formed at the first area A1, and the second gate structures G2 (ex: one second gate structure G2) are formed at the second area A2. The first gate length Lg1 (ex: 16 nm/20 nm) of the first gate structure G1 is smaller than the second gate length Lg2 (ex: 0.25 μm) of the second gate structure G2. Configurations of the first gate structure G1 and the second gate structure G2 are described above, and not redundantly repeated. It is noted that the numerical values of the related elements are provided for illustration, not for the limitation. Thus, the configuration of the related elements can be adjusted, and the numerical values can be chosen and determined according to the practical applications.

Figure 2A:
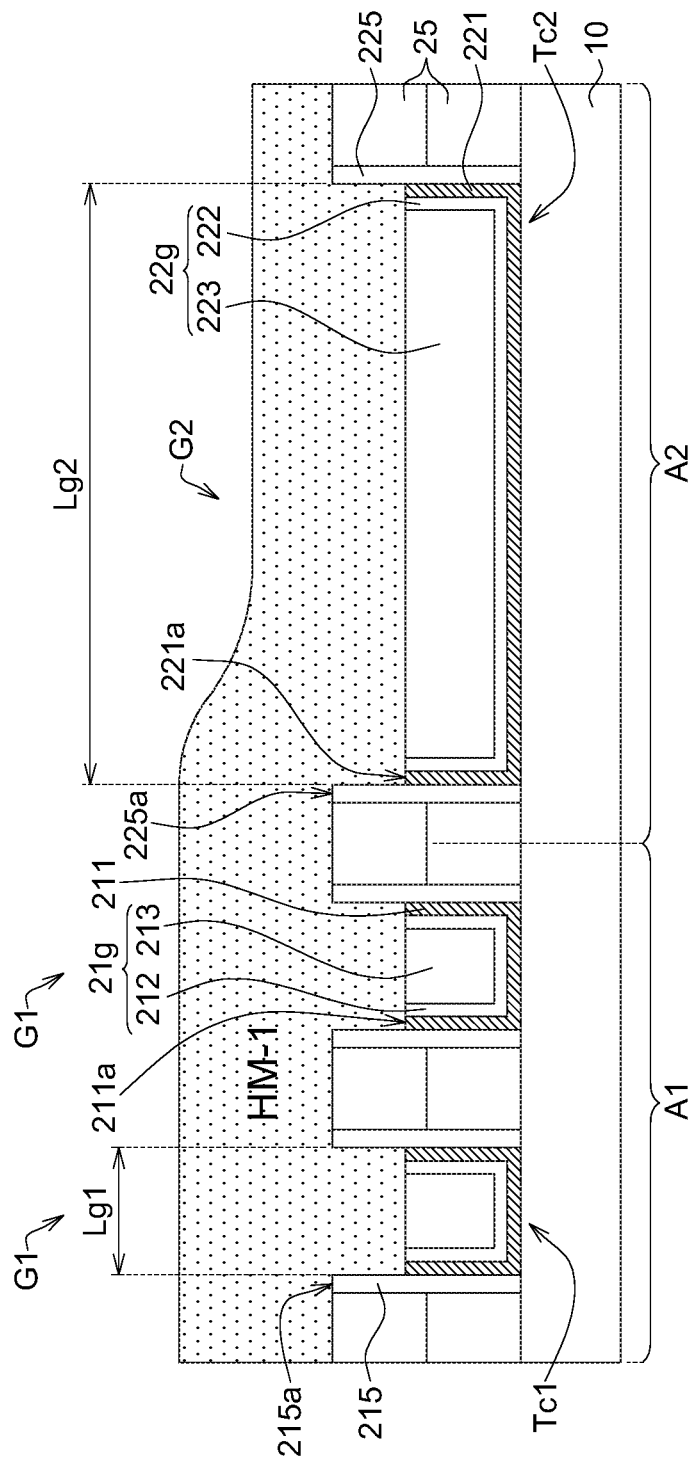
FIG. 2A-FIG. 2F illustrate a method for manufacturing a semiconductor device according to the first embodiment of the disclosure.

As shown in FIG. 2A, the first hardmask HM-1 (such as $N_2$-based SiN, using $N_2$ and silane as the precursor) is deposited (such as by PECVD) on the first gate 21g and the first gate oxide 211 in the first area A1, and the first hardmask HM-1 is also deposited on the second gate 22g and the second gate oxide 221 in the second area A2. The first gate oxide 211 and the first gate 21g are formed in one portion (ex: the lower portion) of the first gate trench Tc1, and the first hardmask HM-1 fully fills the remained portion (ex: the upper portion) of the first gate trench Tc1. Fourier transform infrared spectroscopy (FTIR) can be used for detecting OH bond of the hardmask containing silicon nitride, and no OH bond in the first hardmask HM-1

($N_2$-based SiN using $N_2$ and silane as the precursor) of the embodiment is detected by FTIR.

Figure 2B:
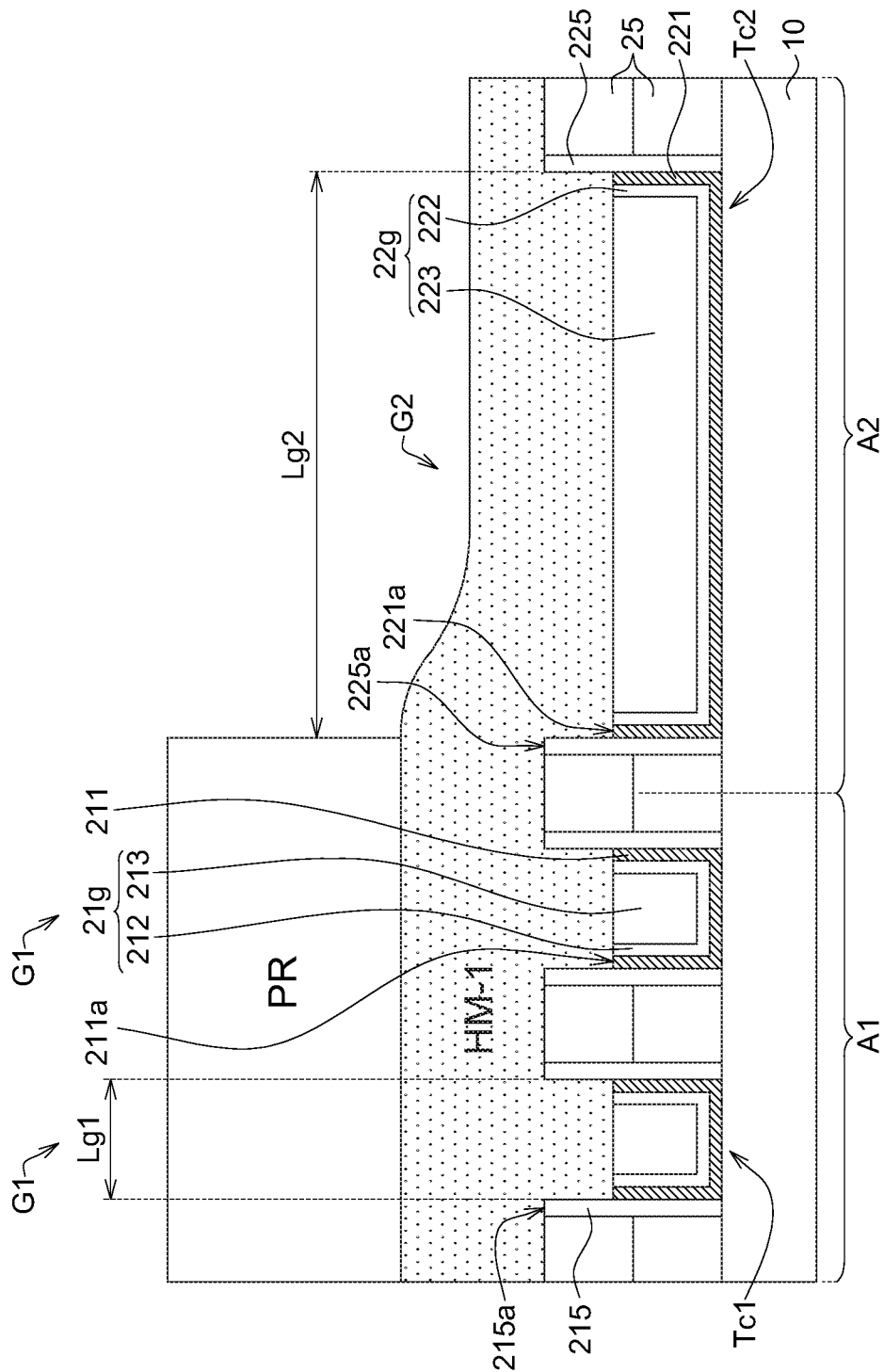

Then, a mask PR is formed for covering any location where needs to reduce Vt. As shown in FIG. 2B, the mask PR is formed for covering the portion of the first hardmask HM-1, wherein the position of the mask PR is corresponding to the first gate structures G1 having narrower gate lengths.

Figure 2C:
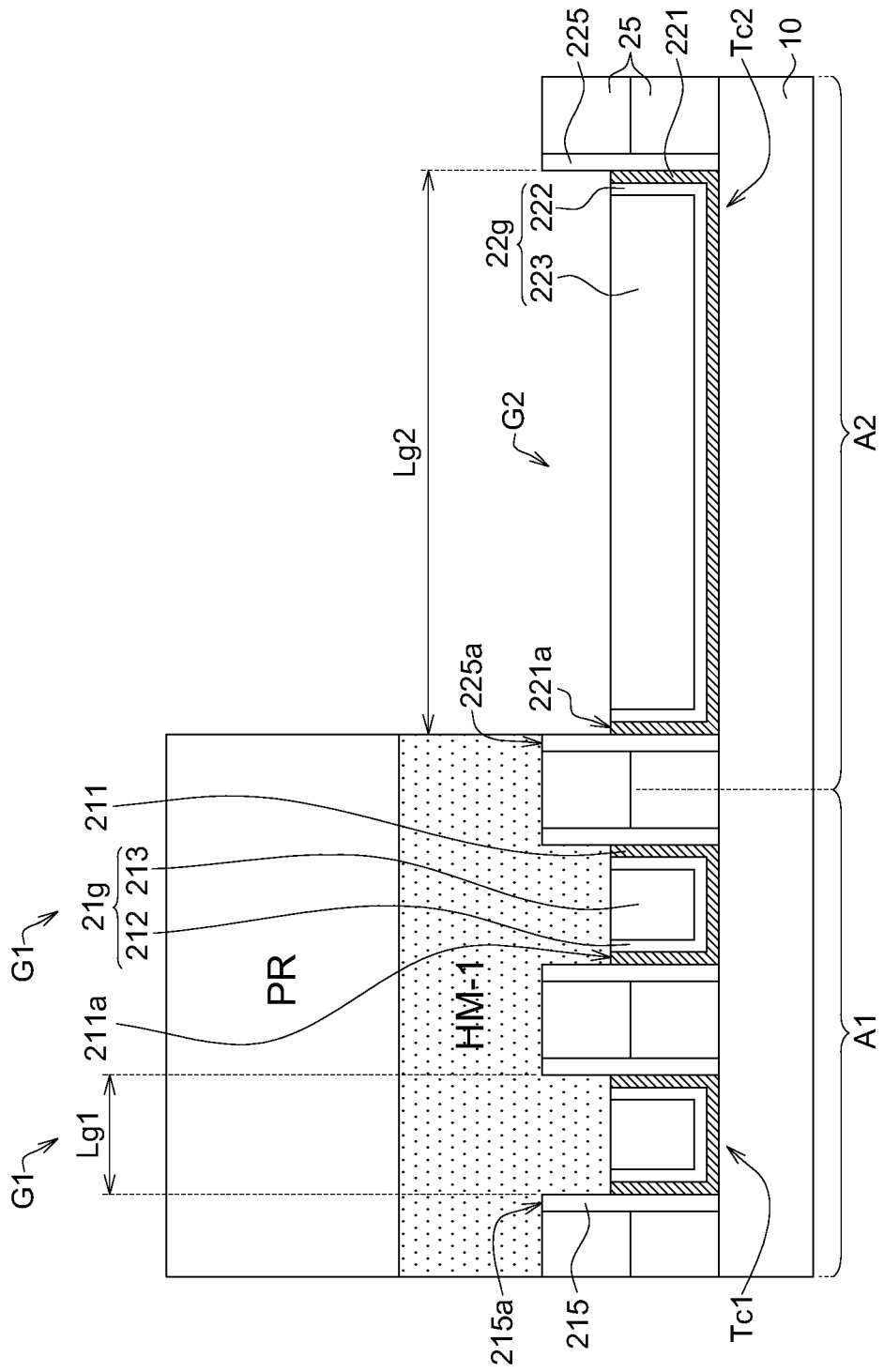
Figure 2D:
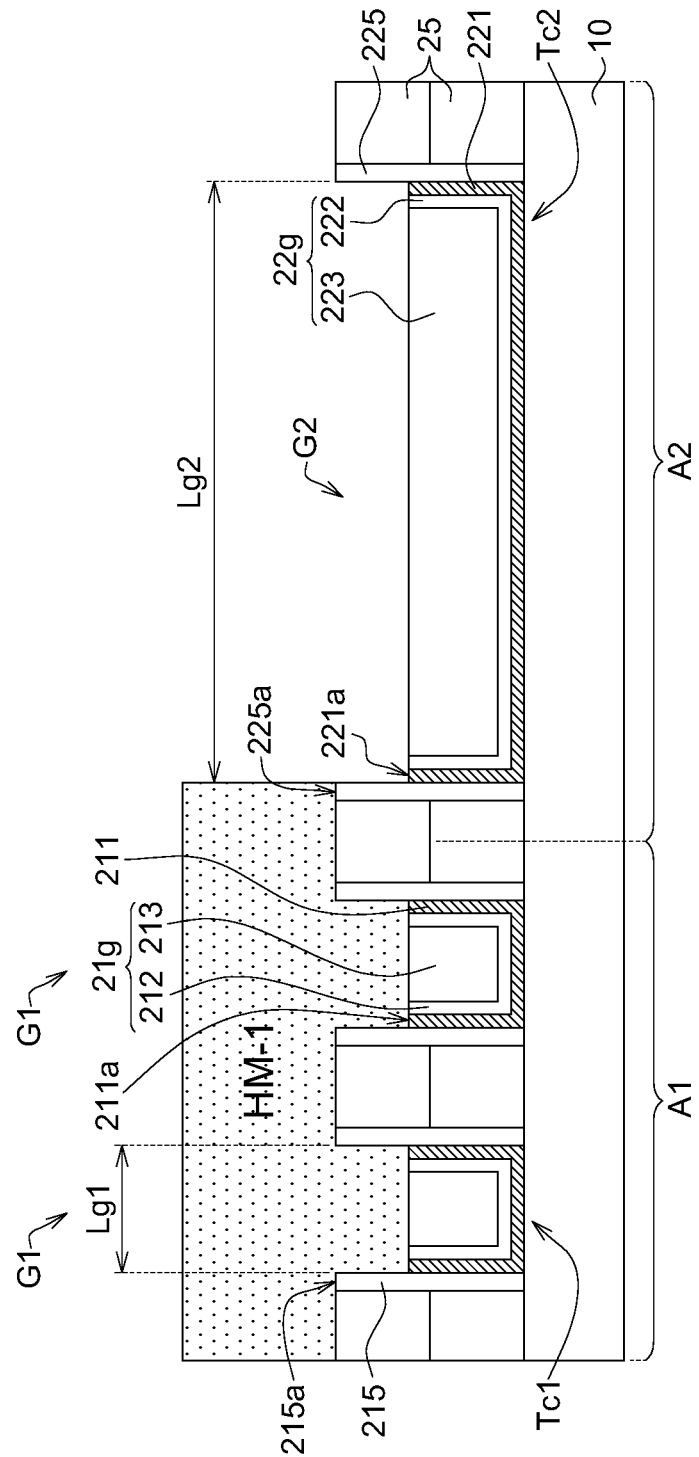

Next, the other portion of the first hardmask HM-1 uncovered by the mask PR is removed, as shown in FIG. 2C. Therefore, the second gate structures G2 in the second area A2 are uncovered by the first hardmask HM-1. Then, the mask PR is removed, as shown in FIG. 2D.

Figure 2E:
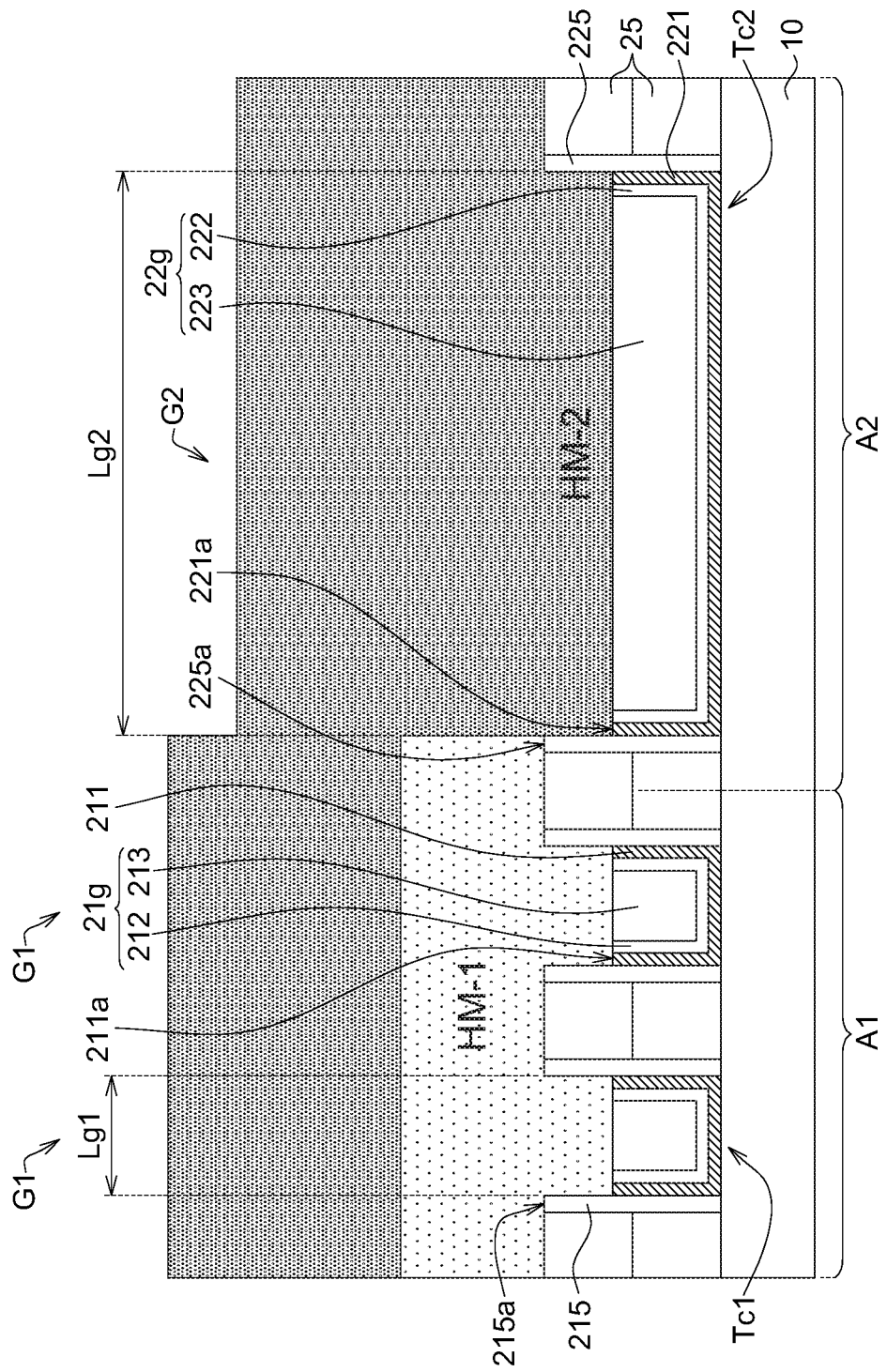

Afterwards, a second hardmask HM-2 (ex: $NH_3$-based SiN, using $NH_3$ and silane as the precursor) is deposited (such as by PECVD) above the first gate 21g in the first area A1 and deposited on the second gate 22g (and directly covering the second gate oxide 221) in the second area A2, as shown in FIG. 2E. In the first area A1, the second hardmask HM-2 is deposited on the first hardmask HM-1. In the second area A2, the second gate oxide 221 and the second gate 22g are formed in one portion (ex: the lower portion) of the second gate trench Tc2, and the second hardmask HM-2 fully fills the remained portion (ex: the upper portion) of the second gate trench Tc2.

Figure 2F:
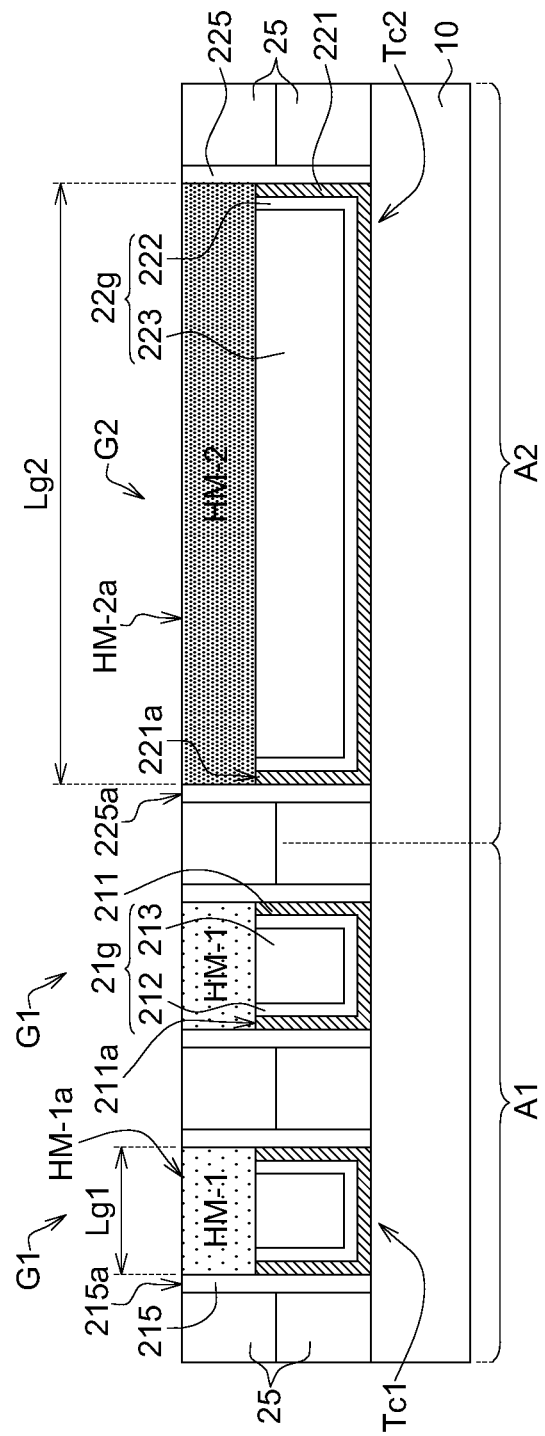

Then, planarization of the second hardmask HM-2 is performed such as by chemical-mechanical polishing (CMP) so as to remove the portion of the second hardmask HM-2 corresponding to the first gate structures G1. As shown in FIG. 2F, after planarization, the remained portions (ex: the upper portions) of the first gate trench Tc1 and the second gate trench Tc2 are fully filled with the first hardmask HM-1 and the second hardmask HM-2, respectively.

Also, in the first embodiment, the first hardmask HM-1 formed on the first gate 21g fully fills the remained space of the first gate trench Tc1 so that the top surface HM-1a of the first hardmask HM-1 is aligned with the top surfaces 215a of the first spacers 215. Similarly, the second hardmask HM-2 formed on the second gate 22g fully fills the remained space of the second gate trench Tc2 so that the top surface HM-2a of the second hardmask HM-2 is aligned with the top surfaces 225a of the second spacers 225.

According to the first embodiment, the first hardmask HM-1 (i.e. the OH-free hardmask) in the first gate trench Tc1 covers the top surface 211a of the first gate oxide 211, which stop OH species from penetrating into the first gate 21g through the first gate oxide 211, thereby decreasing the threshold voltage (Vt) of the first gate structure G1.

Second Embodiment

Figure 3:
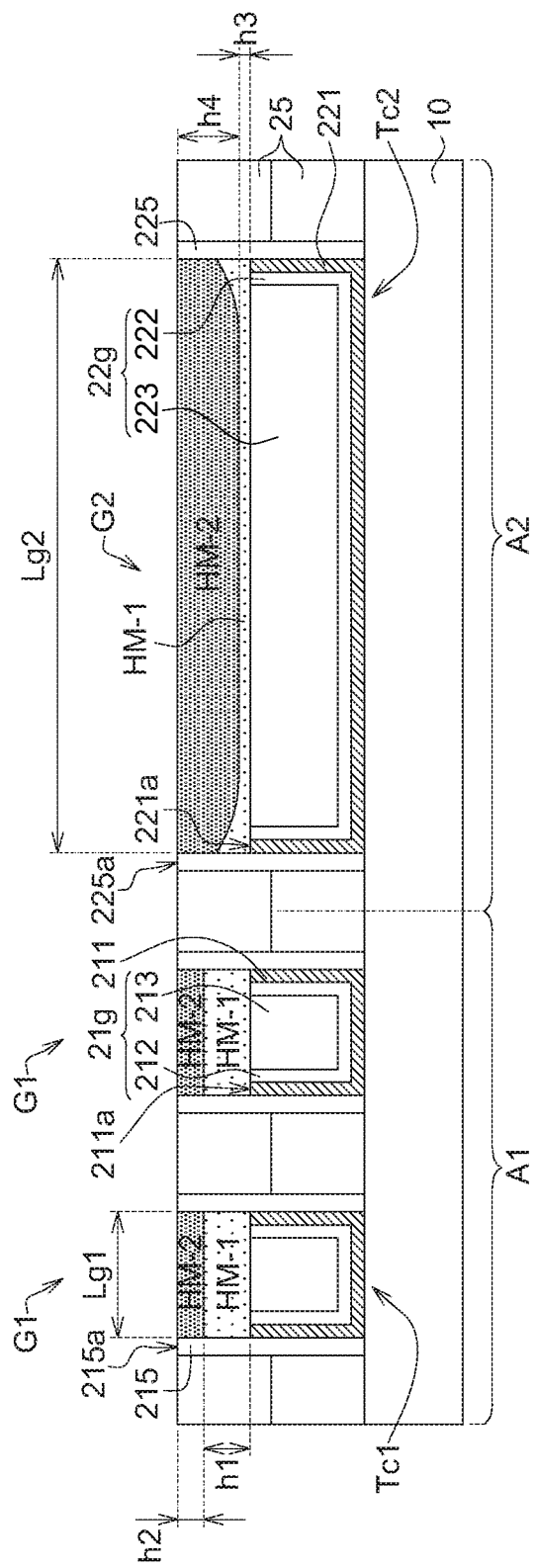
FIG. 3 illustrates a semiconductor device having gate structures according to the second embodiment of the disclosure.

FIG. 3 illustrates a semiconductor device having gate structures according to the second embodiment of the disclosure. The identical elements of the semiconductor devices in FIG. 3 and FIG. 1 are designated with the same reference numerals for the purpose of clear illustration. Also, the structural details of the related elements have been described in the first embodiment, and not redundantly repeated.

In the second embodiment, the first hardmask HM-1 formed on the first gate 21g partially fills the remained space of the first gate trench Tc1. That is, the first hardmask HM-1 doesn't reach the first opening of the first gate trench Tc1. As shown in FIG. 3, the remained space of the first gate trench Tc1 is filled with the first hardmask HM-1 (covering the first gate 21g and the first gate oxide 211) and the second hardmask HM-2 on the first hardmask HM-1, wherein the second hardmask HM-2 (such as $NH_3$-based SiN) has higher OH concentration ([OH]) than the first hardmask HM-1 (such as $N_2$-based SiN, which is free of OH concentration).

One of the manufacturing methods is exemplified for illustrating the procedures for manufacturing the semiconductor device of the second embodiment.

Figure 4A:
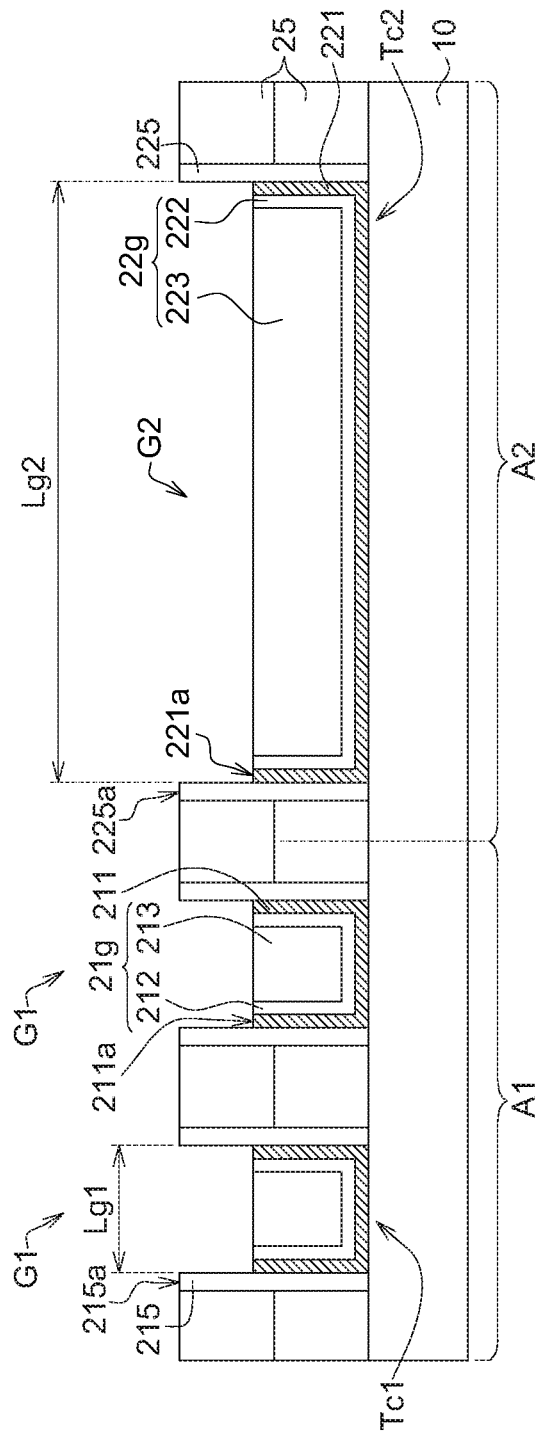
FIG. 4A-FIG. 4D illustrate a method for manufacturing a semiconductor device according to the second embodiment of the disclosure.

FIG. 4A-FIG. 4D illustrate a method for manufacturing a semiconductor device according to the second embodiment of the disclosure. First, a substrate 10 having a first area A1 and a second area A2 is provided, wherein several first gate structures G1 are formed at the first area A1, and several second gate structures G2 (ex: one G2 in FIG. 4A-FIG. 4D for clear illustration) are formed at the second area A2. The first gate length Lg1 (ex: 16 nm/20 nm) of the first gate structure G1 is smaller than the second gate length Lg2 (ex: 0.25 μm) of the second gate structure G2, as shown in FIG. 4A.

Figure 4B:
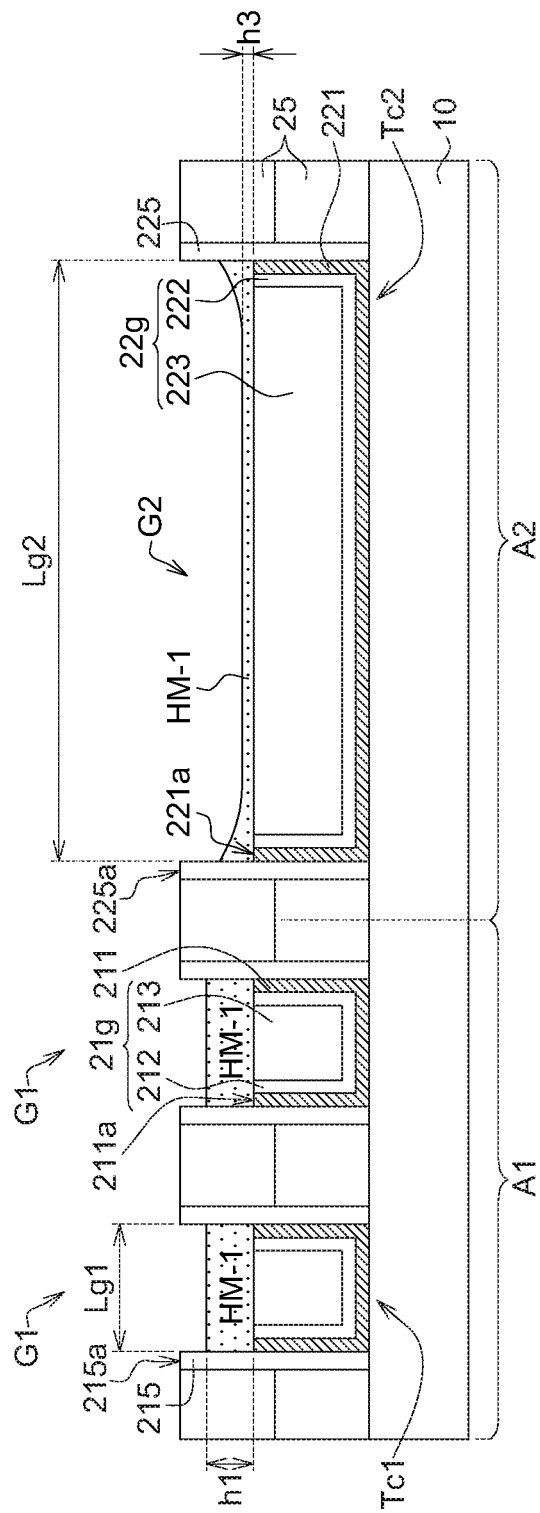

As shown in FIG. 4B, the first hardmask HM-1 (such as $N_2$-based SiN, using $N_2$ and silane as the precursor) is deposited (such as by PECVD) on the first gate 21g and the first gate oxide 211 in the first area A1, and the first hardmask HM-1 is also deposited on the second gate 22g and the second gate oxide 221 in the second area A2. In the second embodiment, the first gate oxide 211 and the first gate 21g are formed in one portion (ex: the lower portion) of the first gate trench Tc1, and the first hardmask HM-1 partially fills the remained space (ex: the upper portion) of the first gate trench Tc1. Also, the second gate oxide 221 and the second gate 22g are formed in one portion (ex: the lower portion) of the second gate trench Tc2, and the first hardmask HM-1 partially fills the remained space (ex: the upper portion) of the second gate trench Tc2.

Figure 4C:
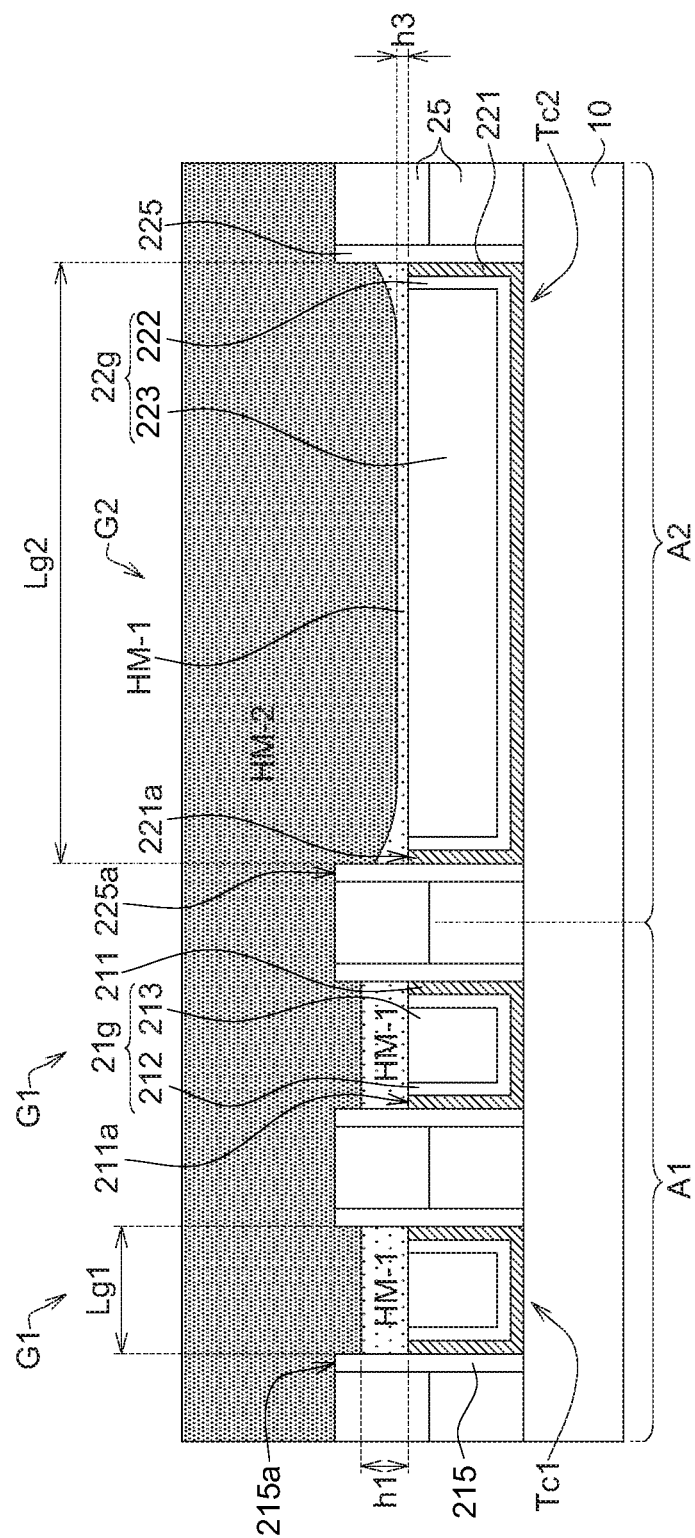

Afterwards, a second hardmask HM-2 (ex: $NH_3$-based SiN, using $NH_3$ and silane as the precursor) is deposited (such as by PECVD) on the first hardmask HM-1; for example, the second hardmask HM-2 is deposited correspondingly to the first gate 21g in the first area A1 and the second gate 22g in the second area A2, as shown in FIG. 4C.

Figure 4D:
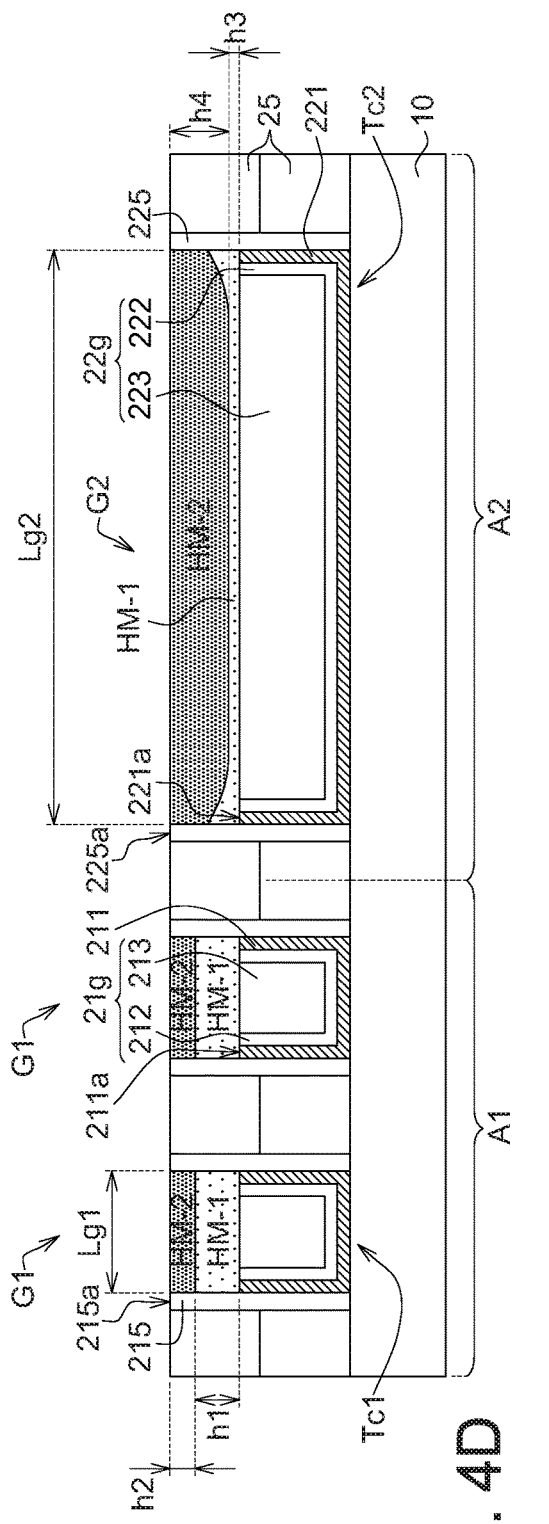

Then, planarization of the second hardmask HM-2 is performed such as by chemical-mechanical polishing (CMP) so as to remove the excess portion of the second hardmask HM-2 above the first spacers 215 and the second spacers 225, as shown in FIG. 4D.

In one embodiment, the first hardmask HM-1 in the first gate trench Tc1 has a first thickness h1, and the second hardmask HM-2 in the first gate trench Tc1 has a second thickness h2, wherein the first thickness h1 is larger than the second thickness h2. Also, in one embodiment, the first hardmask HM-1 in the second gate trench Tc2 has a third thickness h3 and the second hardmask HM-2 in the second gate trench Tc2 has a fourth thickness h4, wherein the third thickness h3 is smaller than the fourth thickness h4, as shown in FIG. 3 and FIG. 4D.

According to the second embodiment, as shown in FIG. 3 and FIG. 4D, the first hardmask HM-1 (i.e. the OH-free hardmask) in the first gate trench Tc1 covers the top surface 211a of the first gate oxide 211, which is able to stop OH species from penetrating into the first gate 21g through the first gate oxide 211, thereby decreasing the threshold voltage (Vt) of the first gate structure G1. Moreover, the first hardmask HM-1 in the second gate trench Tc2 also covers the top surface 221a of the second gate oxide 221, thereby decreasing the threshold voltage (Vt) of the second gate structure G2 to a certain extent. The less amounts of the first hardmask HM-1 deposited, the less drop of the threshold voltage (Vt).

Figure 5:
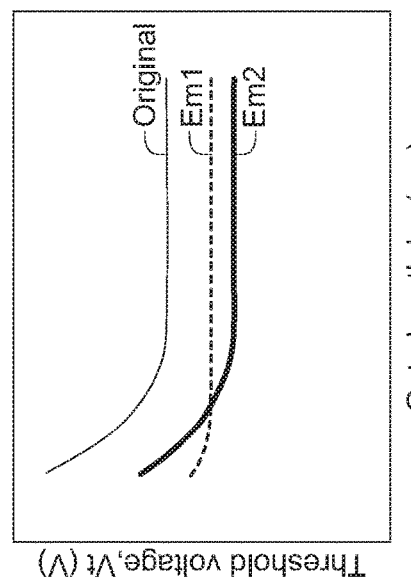
FIG. 5 shows relationships between the threshold voltages (Vt) and gate lengths (Lg) of the gate structures of different types of semiconductor devices.

FIG. 5 shows relationships between the threshold voltages (Vt) and gate lengths (Lg) of the gate structures of different types of semiconductor devices.

Curve "Original" represents the relationships of Vt vs. Lg of a conventional device with the $NH_3$-based SiN hardmask on the gates.

Curve "Em1" represents the relationships of Vt vs. Lg of an embodied device (i.e. the device of the first embodiment) with the first hardmask HM-1 of $N_2$-based SiN formed on the first gate 21g with narrower gate length Lg1, and the second hardmask HM-2 of $NH_3$-based SiN formed on the second gate 22g with wider gate length Lg2.

Curve "Em2"—represents the relationships of Vt vs. Lg of another embodied device (i.e. the device of the second embodiment) with the first hardmask HM-1 of $N_2$-based SiN and the second hardmask HM-2 of $NH_3$-based SiN formed on the $N_2$-based SiN.

According to the results shown in FIG. 5, the semiconductor device of the first embodiment possesses advantages of decreasing the Vt of the first gate 21g, and also reducing the Vt difference (ΔVt) between the first gate 21g and the second gate 22g. Comparing three curves in FIG. 5, Curve "Em1" has the gentlest slope than the other curves.

Also, the semiconductor device of the second embodiment possesses advantages of decreasing the Vt of the first gate 21g and the Vt of the second gate 22g. Accordingly, the Curve "Em2" can be regarded as a shift of the Curve "Original" downwardly.

According to the aforementioned descriptions, the first hardmask HM-1 (i.e. OH-free hardmask) formed on the first gate 21g can fully fill (i.e. described in the first embodiment) or partially fill (i.e. described in the second embodiment) the remained space of the first gate trench Tc1, so that the OH-free hardmask (i.e. the first hardmask HM-1) at least covers the top surface 211a of the first gate oxide 211 in the first gate 21g (the gate with narrower gate length), thereby stopping OH from penetrating into the first gate 21g through the first gate oxide 211, and decreasing the threshold voltage (Vt) of the first gate structure. The present disclosure can be applied to manufacture different types of the semiconductor devices having gates with lower threshold voltages (Vt) so as to improves the electrical characteristics of the semiconductor devices. The application areas of the semiconductor devices can be determined according to the design requirements of practical application. For example, the OH-free hardmask (ex: $N_2$-based SiN) of the embodiment can be formed on any location where need to reduce Vt, such as the gates with narrower gate lengths (ex: Lg=16/20 nm, or gates in the SRAM area). Also, if $NH_3$-based SiN is formed on the gate with wider gate length (ex: gates in the peripheral area), the Vt difference (ΔVt) between the narrow gate and the wider gate can be further reduced, which contribute to Vt roll-up control (ex: represented by the Curve "Em1") and improves the electrical characteristics of the semiconductor device. Also, the manufacturing method for forming embodied structure causes no damage to the gates or the related components of the gate structure, so that the embodied semiconductor device possesses complete gate profiles and heights. Additionally, the manufacturing method for forming embodied structure is easy and compatible with the current process, which is suitable for mass production.

Other embodiments with different configurations of known elements in the semiconductor devices can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications without departing from the spirit of the disclosure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a semiconductor device, comprising:
    providing a substrate having a first area and a second area;
    forming a plurality of first gate structures at the first area, and at least one of the plurality of first gate structures comprising a first hardmask on a first gate, and the first gate structure having a first gate length;
    forming a plurality of second gate structures at the second area, and at least one of the plurality of second gate structures comprising a second hardmask on a second gate, and the second gate structure having a second gate length;
    wherein the first gate length is smaller than the second gate length, and the first hardmask comprises at least a portion of nitrogen ($N_2$)-based silicon nitride (SiN) which is free of OH concentration, and the second hardmask on the second gate has higher OH concentration than the first hardmask on the first gate.

2. The method according to claim 1, wherein the first hardmask is formed by using nitrogen and silane as precursor.

3. The method according to claim 1, wherein the second hardmask comprises a portion of ammonia ($NH_3$)-based silicon nitride (SiN), and formed by using $NH_3$ and silane as precursor.

4. The method according to claim 1, wherein said at least one of the plurality of first gate structures comprises:
    a first gate oxide surrounding sidewalls and a bottom surface of the first gate,
    wherein the first hardmask formed on the first gate covers top surfaces of the first gate oxide and the first gate.

5. The method according to claim 4, wherein the first gate oxide is formed as a first liner in a first gate trench, the first hardmask and the first gate are formed in the first gate trench, and a top surface of the first gate oxide is spaced apart from a first opening of the first gate trench, wherein the first hardmask covers the top surface of the first gate oxide and a top surface of the first gate.

6. The method according to claim 5, wherein the first hardmask formed on the first gate fully fills remained space of the first gate trench.

7. The method according to claim 5, wherein the first hardmask formed on the first gate partially fills remained space of the first gate trench.

8. The method according to claim 7, wherein said remained space of the first gate trench are filled with:
    the first hardmask on the first gate; and
    another second hardmask on the first hardmask,
    wherein said another second hardmask has higher OH concentration than the first hardmask.

9. The method according to claim 8, wherein the first hardmask in the first gate trench has a first thickness and said another second hardmask in the first gate trench has a second thickness, and the first thickness is larger than the second thickness.

10. The method according to claim 1, wherein said at least one of the plurality of second gate structures comprises:
   a second gate oxide formed as a second liner in a second gate trench;
   the second gate formed in the second gate trench, and sidewalls and a bottom surface of the second gate being surrounded by the second gate oxide;
   the second hardmask formed above the second gate; and
   second spacers formed adjacent to the second gate trench, and the second spacers higher than the second gate oxide in the second gate trench.

11. The method according to claim 10, wherein the second hardmask covers top surfaces of the second gate oxide and the second gate, wherein the second hardmask in the second gate trench has higher OH concentration than the first hardmask in the first gate trench.

12. The method according to claim 11, wherein the second hardmask formed on the second gate fully fills remained space of the second gate trench.

13. The method according to claim 10, wherein another first hardmask is formed on the second gate, and said another first hardmask in the second gate trench covers top surfaces of the second gate oxide and the second gate, and the second hardmask is formed on said another first hardmask in the second gate trench, wherein the second hardmask has higher OH concentration than said another first hardmask.

14. The method according to claim 13, wherein said another first hardmask formed on the second gate partially fills remained space of the second gate trench, and the second hardmask formed on said another first hardmask reaches a second opening of the second gate trench.

15. The method according to claim 13, wherein said another first hardmask in the second gate trench has a third thickness and the second hardmask in the second gate trench has a fourth thickness, and the third thickness is smaller than the fourth thickness.

* * * * *